United States Patent [19]
Le et al.

[11] Patent Number: 5,313,324
[45] Date of Patent: May 17, 1994

[54] SOLID STATE OPTICAL CONVERTER

[75] Inventors: Han Q. Le, Newton; William D. Goodhue, Chelmsford, both of Mass.

[73] Assignee: Massachusetts Institute of Technology, Cambridge, Mass.

[21] Appl. No.: 676,269

[22] Filed: Mar. 27, 1991

[51] Int. Cl.[5] .............................................. G02B 5/14
[52] U.S. Cl. .................................. 359/344; 359/346; 257/79
[58] Field of Search .................... 359/337, 344, 346; 357/17, 30; 372/21, 45, 71

[56] References Cited

U.S. PATENT DOCUMENTS

| 3,679,994 | 7/1972 | Nguyen et al. | 372/45 |
| 3,824,493 | 7/1974 | Habbi et al. | 372/45 |
| 3,982,207 | 9/1976 | Dingle et al. | 359/344 |
| 4,007,978 | 2/1977 | Holton | 372/45 |
| 4,034,311 | 7/1977 | Itoh et al. | 372/45 |
| 4,964,134 | 10/1990 | Westbrook et al. | 372/45 |
| 4,991,179 | 2/1991 | Deppe et al. | 372/45 |

OTHER PUBLICATIONS

Parish et al, Applied Physics Letters, vol. 16, #8, Apr. 15, 1970, pp. 326–327.

Le et al, Appl. Phys. Lett., vol. 60, #11, pp. 1280–1282, Mar. 16, 1992; abst. only supplied.

Primary Examiner—Nelson Moskowitz
Attorney, Agent, or Firm—Wolf, Greenfield & Sacks

[57] ABSTRACT

This invention provides an optical converter suitable for use as the gain medium in lasers, optical amplifiers and other optical devices. The converter consists of at least one and preferable two or more optical converter elements which are sandwiched and separated by inactive dielectric layers. An optical pump beam may be passed to the active converter elements through an anti-reflection layer at one surface of the converter and a high reflection mirror may be provided at the opposite side of the converter to reflect the pump beam incident thereon back into the converter for a second pass. Each converter element has one or more absorber layers, at least one radiation layer receiving energy from the absorber layers and preferably outputting energy at a slightly different wavelength than the wavelength at which the absorber layers optimally absorb, and preferably at least one index-of-refraction compensator (IRC) layer which compensates for changes in index-of-refraction induced by the absorber and radiator layers to provide a low divergence far field optical intensity profile for the converter with no substantial side lobes.

19 Claims, 6 Drawing Sheets

SOLID STATE OPTICAL CONVERTER

FIELD OF THE INVENTION

This invention relates to solid state optical converters, and more particularly to an optical gain medium formed by a plurality of discrete optical converter elements.

BACKGROUND OF THE INVENTION

Optical gain mediums are used extensively in optical devices such as lasers and optical amplifiers. While such mediums may be liquid or gaseous, solid state gain mediums are being increasingly utilized in such applications for a variety of reasons including more compact construction and ease of handling.

Heretofore, a solid state optical gain medium has typically been constructed of a single semiconductor material. However, the semiconductor materials typically used for such applications have short absorption depths for optical photons, which depths are generally in the order of 1 to 2 microns. This absorption depth is roughly the same as the wavelength of the photon energy being amplified in such optical converter gain mediums, resulting in a relatively high numerical aperture for optical access to the medium. In other words, light tends to diverge strongly therefrom, making it difficult to couple light into and out of the medium.

Another problem with bulk semiconductor gain mediums is that they absorb and radiate optical energy at nearly the same wavelength. Thus, some of the energy being radiated is also reabsorbed, raising the pump density requirement for optical gain.

As a result of the problems indicated above, existing bulk semiconductor optical gain mediums operate with relatively high losses and relatively low quantum efficiency.

Further, in order to obtain external mode matching, it is desirable that the gain medium provide a particular optical and gain profile. Heretofore, because of strong beam divergence from the medium, heavy, bulky and expensive external optical elements have been required to achieve such mode matching. Such external optical elements are undesirable in all applications, and are a particular problem in applications where weight and space are at a premium, such as in satellites.

Therefore, a need exists for an improved optical converter gain medium which, under optical pumping, provides optical gain with high optical uniformity, controlled gain and optical intensity profile, high quantum efficiency, low loss and low numerical aperture for easy optical access.

SUMMARY OF THE INVENTION

In accordance with the above, this invention provides a solid state optical converter utilizing one or more optical converter elements. Each optical converter element has at least one optical energy absorber layer having a first energy gap and at least one radiator layer having a lower energy gap and a lesser width than the absorber layer. The radiator layer is positioned relative to the absorber layer to receive energy therefrom. For a preferred embodiment, each element also has an index of refraction compensator (IRC) layer having an index-of-refraction lower than that of the absorber layer, the IRC layer being non-absorptive (i.e. inactive) and contributing to the gain and optical mode profiles. The optical converter elements are sandwiched and separated by inactive dielectric layers which are generally non absorptive of optical energy. An anti-reflection layer or multi-layer stack may be provided on an exterior surface of the converter, permitting efficient optical pumping of the optical converter elements.

Typically, there are a plurality of optical converter elements in a converter and a plurality of absorber layers in each converter element. Each absorber layer has a thickness $d_{ai}$ and each radiator layer has a thickness $d_{ri}$, the thicknesses being selected such that $\Sigma d_{ai} >> \Sigma d_{ri}$.

Where the converter is to be optically pumped with optical radiation having a wavelength $\lambda$, the thickness of the entire converter, including the thickness of both the optical converter elements and the inactive dielectric layers, should be substantially greater than $\lambda$ (i.e. in the area of 5 to 20 times as great). A high reflectivity mirror may also be provided on the side of the converter opposite the anti-reflection layer(s), such mirror being oriented to reflect optical radiation incident thereon back into the converter. For preferred embodiments, at least the absorber layers and radiator layers are formed of direct-gap III–V semiconductors.

The foregoing and other objects, features and advantages of the invention will be apparent from the following more particular description of preferred embodiments of the invention as illustrated in the accompanying drawings.

IN THE DRAWINGS

DETAILED DESCRIPTION

Figure 1:
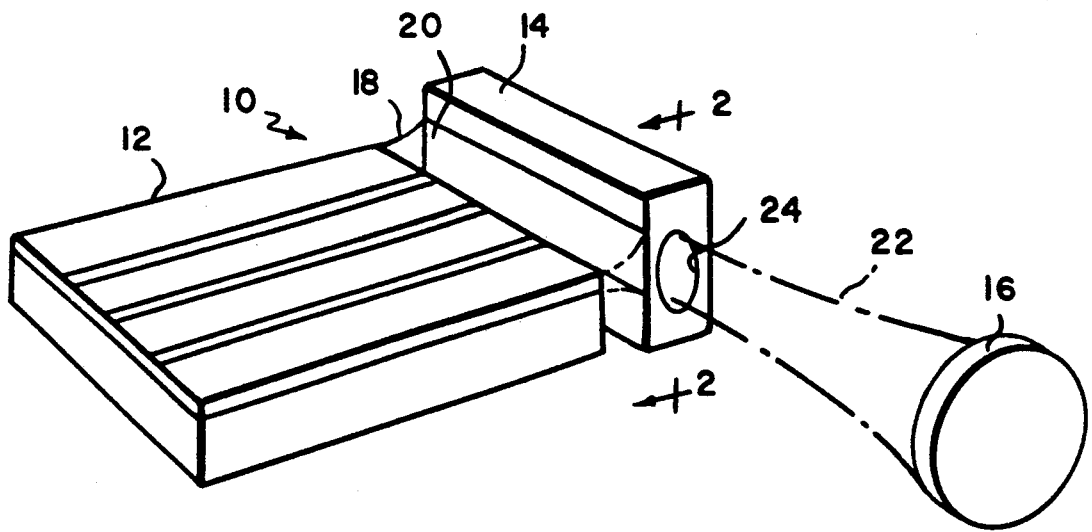
FIG. 1 is a front-top-perspective view of an optical converter employing the teachings of this invention.

Referring first to FIG. 1, an optical system 10 is shown which includes a pump source 12, an optical gain medium 14 and an output coupler 16. Pump source 12 is preferably one or more solid state lasers, for example a Ti:Sapphire laser or a diode laser. A lens (not shown) may be provided between pump source 12 and gain medium 14 to properly focus pump beam 18 on an active region 20 of the gain medium. The output beam 22 from face 24 of the gain medium is applied to output coupler 16. Face 24 should have an anti-reflection coating at at least the output wavelength. For the preferred embodiment of the invention, output beam 22 will have a low numerical aperture.

Figure 2:
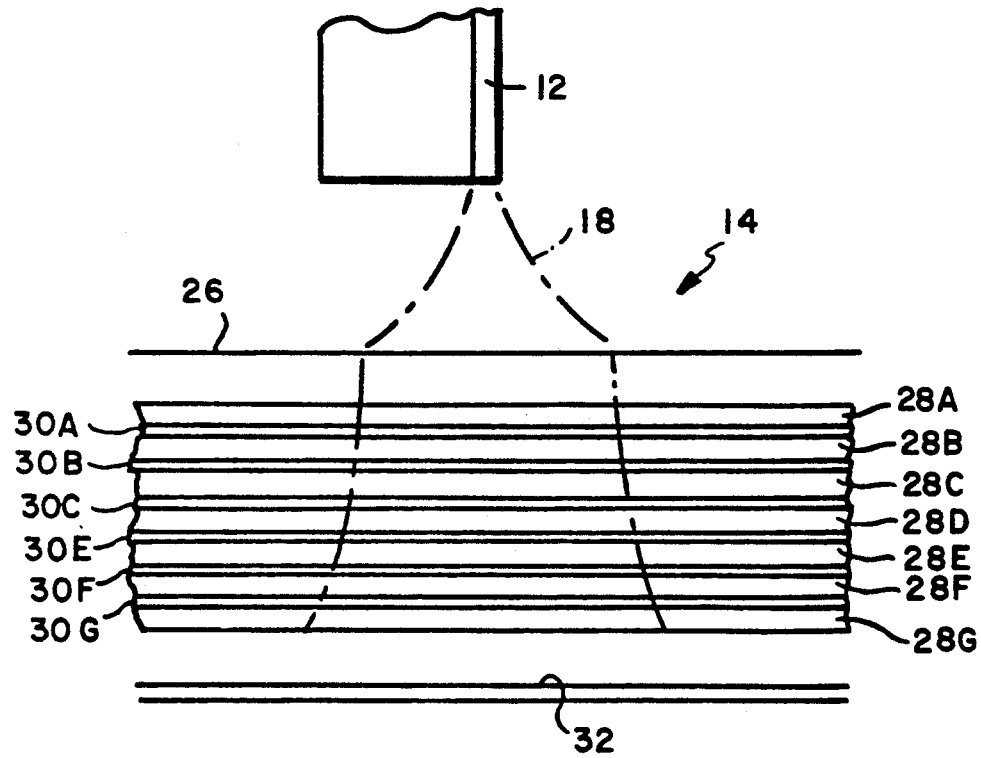
FIG. 2 is an enlarged sectional view taken along the line 2—2 in FIG. 1.

As may be best seen in FIG. 2, pump beam 18 passes through an anti-reflection layer 26 adjacent to active region 20. Layer 26 may be a single layer or multilayer stack; which layer(s) can be ingrown or a coating. In region 20, the beam passes through a non-absorbing, and thus inactive, dielectric or insulating layer 28 and then through six active elements 30A–30F. The active elements 30 are each sandwiched by and separated by inactive dielectric layers 28A–28G. If it is desired that pump beam 18 have two passes rather than a single pass through active region 20, a high reflectivity dielectric mirror 32 is grown in dielectric layer 28G which reflects the pump beam back into active region 20. Mirror 32 may also be formed or provided in other ways known in the art, for example, by providing a highly reflective coating on the back surface of region 20.

Each optical converter element 30 is formed of a plurality of layers, each performing a selected function. In particular, each element 30 has at least one layer for absorbing optical energy from pump beam 18 and at least one layer for radiating optical energy. The materials are selected so that the absorption wavelength and the radiation wavelength are sufficiently different to prevent radiated optical energy from being reabsorbed in the medium, thereby eliminating a significant source of losses in the gain medium.

Figure 3A:
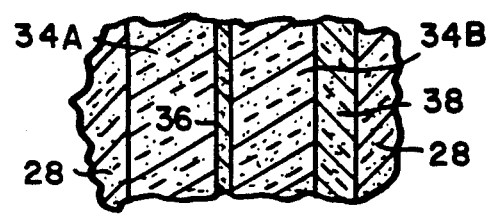
FIGS. 3A, 4A, 5A and 6A are sectional side views of a single optical converter element for various illustrative embodiments o the invention.

FIG. 3A illustrates a simple configuration for a converter element 30. The element includes two absorber layers 34A and 34B sandwiching a radiator layer 36. An index of refraction compensating (IRC) layer 38 is provided between absorbing layer 34B and dielectric layer 28.

The layers 28, 34, 36 and 38 are preferably grown using standard techniques for growing layers of semiconductor alloys, including the superlattice approach. With this approach, rather than growing the semiconductor alloy, layers of appropriate relative widths in the nanometer range are grown of each alloy component to obtain a layer with the alloy characteristics. As will be discussed in greater detail later, each of the layers may be uniform across its entire width or a layer may be graded to achieve a desired band-gap energy profile.

In order to achieve the results desired for this invention, the thicknesses $d_{ai}$ for each absorption layer and the thicknesses $d_{ri}$ for each radiation layer 36 should be selected such that for each element $$\Sigma d_{ai} >> \Sigma d_{ri} \qquad (1)$$

Typically, there would only be a single radiator layer for an element, but two or more radiator elements may be provided in some applications to reduce radiant bandwidth in high intensity pumping applications. The combined thickness for the absorption layers for a given element might range from 1% to 50% of the absorption length for the absorber material. However, if only a single converter element 30 is utilized in active region 20, a configuration which is within the contemplation of the invention, but is not preferred, the sum of the widths of the absorber layers would be closer to 100% of the absorber material absorption length in order to optimize energy output from the system. In a typical application where the absorption length of the absorber material is 1 micrometer, the combined width of the absorber layers in an element might be from 10 nm to 500 nm. In general, the criteria for selecting the absorption widths of the absorber layers in a given cell is to optimize power absorption in the converter by assuring that there is enough energy for each element to be optimally utilized.

In particular, with a one-pass total absorption thickness D, the total amount of pump power which is absorbed by converter 14 during a double pass of the beam through the converter is $$1 - e^{-2\alpha D} \qquad (2)$$

where $\alpha$ is the absorption coefficient of the material utilized for absorber layer 34. With N active elements 30, the average amount of pump power absorbed by each element is thus $$\frac{1 - e^{-2\alpha D}}{N} \qquad (3)$$

The desired absorption profile for converter 14 is defined as $\{g_i\}$, where $g_i$ is the absorption fraction by the absorbers 34 of the $i_{th}$ converter 30. For purposes of this discussion, element 1 will be the element closest to mirror 32 (FIG. 2) (i.e. the element 30G). A constraint on the set $\{g_i\}$ is that $$\sum_{i=1}^{N} g_i = 1 - e^{-2\alpha D} \qquad (4)$$

If a uniform profile is desired wherein every element absorbs the same amount of pump power, then $$g_i = (1 - e^{-2\alpha D})/N \qquad (5)$$

for all i. To determine the thickness $d_i$ for the absorbers of the $i^{th}$ layer, the following set of recursive equations is solved for $d_i$:

$$g_1 = 2e^{-\alpha D} \sinh \alpha d_1 \qquad (6)$$

$$g_2 = 2e^{-\alpha D} [\sinh \alpha(d_1 + d_2) - \sinh \alpha d_1]$$

$$\cdots$$

$$g_i = 2e^{-\alpha D}\left[\sinh\left(\alpha \sum_{k=1}^{i} d_k\right) - \sinh\left(\alpha \sum_{k=1}^{i-1} d_k\right)\right]$$

As an example, for $\alpha = 1 \ \mu m^{-1}$, $D = 1 \ \mu m$, $N = 4$, and uniform $g_i = (1 - e^{-2\alpha D})/N = 21.6\%$, then, $d_1 = 0.2897 \ \mu m$, $d_2 = 0.2685 \ \mu m$ and $d_4 = 0.2050 \ \mu m$.

Once $d_i$ has been determined for the absorber layers of a given element, the thicknesses of the indvidual absorber layers in the element are selected such that the sum of these absorber layer thicknesses equals the calculated absorber thickness for the element. Typically, all of the absorber layers in a given element would be of equal width, although this is by no means a limitation on the invention.

The combined thickness $d_r$ of the radiator layers 36 would typically be much smaller than that for the absorption layers, but may range from approximately 3 nm to 500 nm. A small $d_r$ results in a quantum well configuration whose advantages for lasers has been well established including low exertion density requirements for optical gain. Thus, for an illustrative implementation of the invention, $\Sigma d_r$ for an element is approximately 8 nm.

The width and material of the index of refraction layer or layers of an element is selected to compensate for the change in index of refraction induced by the other two layers such that there are no strongly confined optical guide modes associated with a particular element 30. The effect of this will be described later in conjunction with FIG. 8. Typical combined widths for IRC layers in an element might be in the 25 to 50 nanometer range.

The materials utilized for each of the layers can vary, but need to satisfy certain minimum criteria. First, the material of the absorber layer must absorb photon energy at the wavelength of pump beam 18. This means that the effective band gap energy of the absorber must be less than the pump beam energy. The material of the radiator layer 36 must emit photons at a desired wavelength which is preferably different than the wavelength at which photons are optimally absorbed by the absorber layers. The effective band gap energy of the radiator must thus be equal to the desired output photon energy and this effective band gap energy must be the lowest among all the layers. It is desirable that the effective band gap of the absorber layers and radiator layers be as close to each other as possible to lower the excess energy per photon and reduce thermal load. The effective band gap energies of the IRC layers 38 and of the dielectric layers 28 are higher than those of the other layers, with the IRC layers normally having the highest band-gap energies. Thus, these layers are substantially non-absorbers of photon energy and are inactive in the system except for controlling output band-gap energy and gain profiles. IRC layer 38 should also be of a low index-of-refraction material.

For preferred embodiments, all of the layers, including dielectric inactive layers 28 and the layers 34, 36 and 38 of elements 30, are formed of direct-gap III–V semiconductor materials. The materials for the absorber layers and radiator layers should also be direct gap materials. A direct gap material is a material which luminesces efficiently under optical pumping (i.e. a material in which light can be recombined directly without requiring a phonon). III–V semiconductor materials are materials which are formed of a combination of materials from column 3 and column 5 of the periodic table. Depending on ratios, the same combination of materials may be used for all of the layers. However, there are preferred materials for each of the layers. The following is a table of materials which can be used for the various layers, indicating a preferred material and alternative materials.

| Generic Function | Material used | Alternate materials |
| --- | --- | --- |
| low band gap radiator (providing optical gain) | $In_xGa(1-x)As$ $x = 8\%$ to $10\%$ | (Al,Ga)As;(GA,In) (As,P);(Al,Ga)Sb |
| middle band gap absorber (to absorb pump power) | GaAs | Same as above |
| index-of-refraction compensator (usually higher gap materials) | AlAs,AlGaAs | Same as above |
| dielectric to fill in between active units | $Al_xGa_{(x-1)}As$ $r \sim 10\%$ | Same as above |

The advantage of the inequality shown in Equation 1 is that once the amount of energy absorbed by the absorber is transferred into the radiators, the energy density in the radiator is higher than that of the absorber by a factor proportional to the width ratios. Higher energy density in the radiators results in higher optical gain and lower lasing threshold for the converter.

Figure 3B:
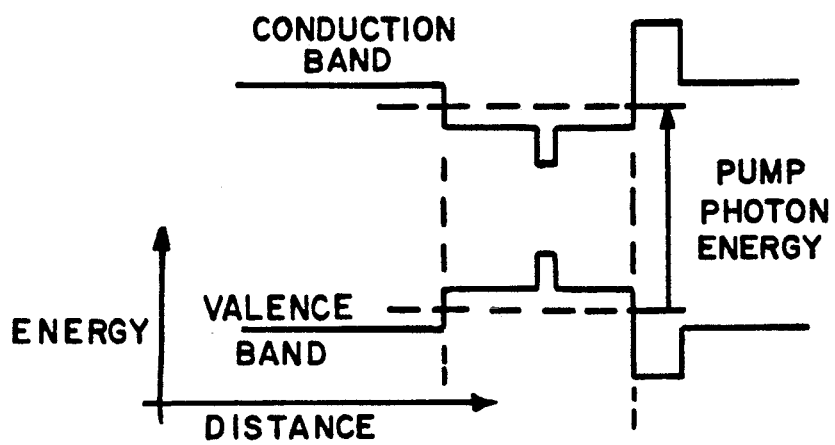
FIGS. 3B, 4B, 5B and 6B are energy profile diagrams for the embodiments shown in FIGS. 3A, 4A, 5A and 6A, respectively.

In FIG. 3A, the absorption layers 34A and 34B are ungraded and of substantially equal width, resulting in the energy profile shown in FIG. 3B. From this figure, it is seen that the photons are pumped by the pump beam to an energy above that of the absorption and radiation layers, but below that of the insulating and IRC layers.

Figure 4A:
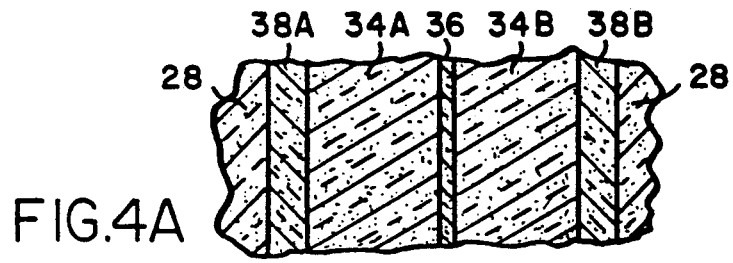
Figure 4B:
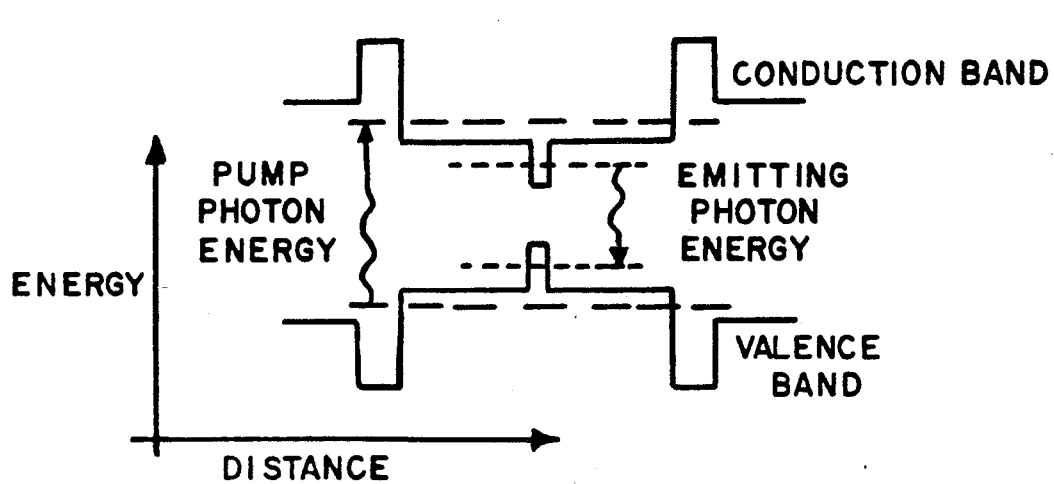
Figure 5A:
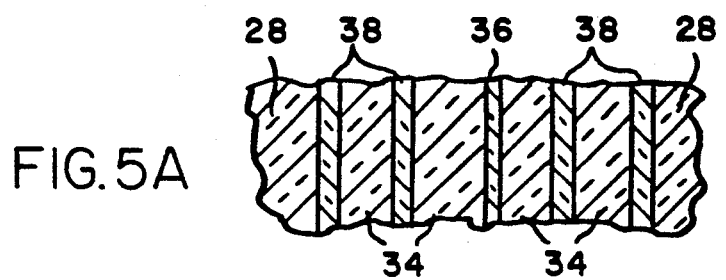
Figure 5B:
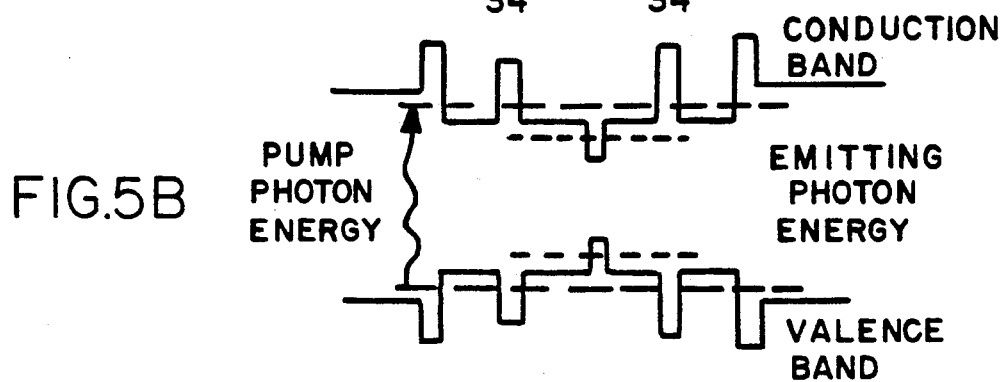

FIG. 4A shows a preferred embodiment for a converter element 30 which differs from that of FIG. 3A in that it has IRC layers 38A and 38B on opposite ends of the element, this configuration providing somewhat superior mode matching. The energy profile for this element is shown in FIG. 4B. In FIG. 5A, there are four absorber layers 34 and four IRC layers 38. For purposes of illustration, the thicknesses of the inner absorber layers are shown as being slightly greater than those of the outer absorber layers and the material of the outer IRC layers are shown as having higher energy gaps and lower index of reflection than the inner layers. The resulting energy profile is shown in FIG. 5B.

Figure 6A:
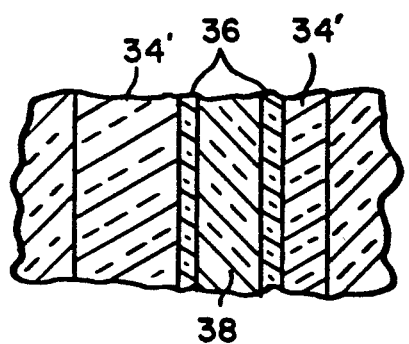
Figure 6B:
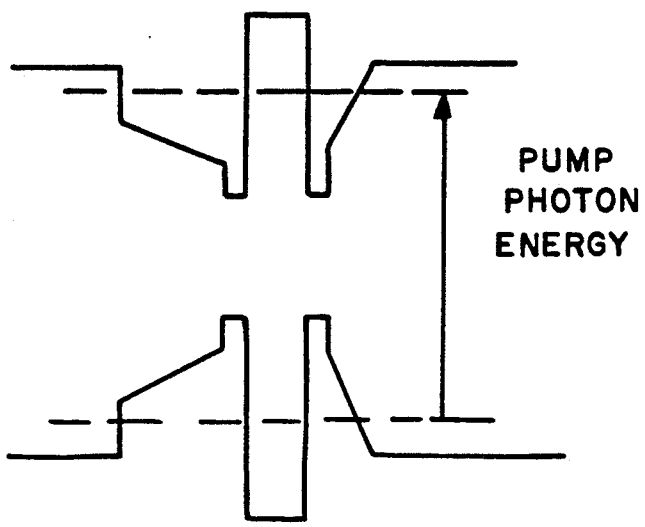

In FIG. 6A, the IRC layer 38 separates two radiating layers 36, with the two absorbing layers 34 being linearly graded to enhance electron/hole diffusion from the absorber layers. The energy profile for this conversion element is shown in FIG. 6B.

The various element layer combinations shown in FIGS. 3–6 are merely illustrative of possible layer combinations and is by no means intended to be exhaustive. Thus, in order to achieve desired band-gap energy profiles, a given element 30 may have any number of absorption layers, may have one or more radiations layers and may have one or more IRC layers, each of which layers may be of a selected width and may either be graded or ungraded as desired. The only constraint on the placement of the various layers is that an absorber layer be within approximately 100 nanometers of a radiation layer so that excited electron holes may be efficiently collected from the absorption layer. It is preferable that a radiation layer be sandwiched by absorption layers.

Figure 7A:
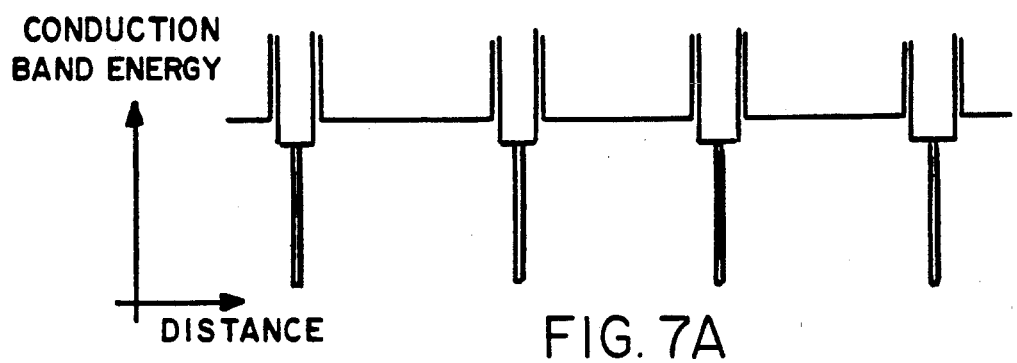
FIGS. 7A and 7B are a band gap energy profile and an index-of-refraction profile, respectively, for an illustrative four element converter, each of which elements is of the type shown in FIG. 4A.

FIG. 7A illustrates the band gap energy profile for a converter having four converter elements 30 of the type shown in FIG. 4A. The absorption layer thicknesses are basically those derived earlier for a four element converter with a mirror 32 so that the pump beam makes a double pass through the active region 20.

Figure 7B:
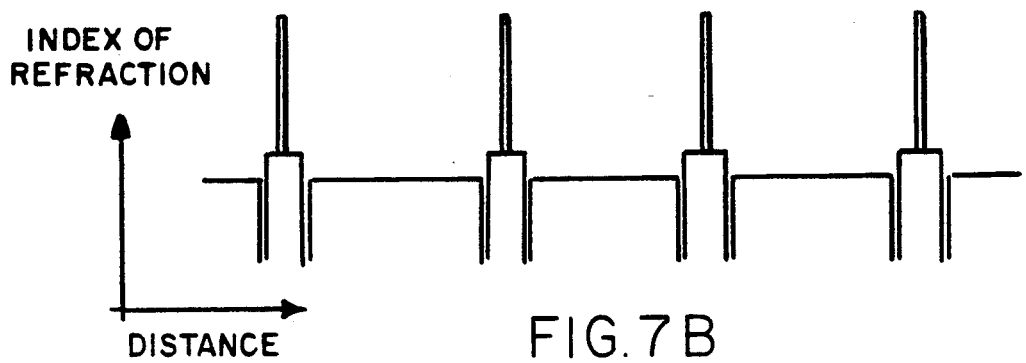

An important factor to be taken into account in selecting material and thicknesses for the various layers in a converter 14 are optical intensity profiles. Changes in index-of-refraction which are inherently caused by various layers are illustrated in FIG. 7B for an illustrative embodiment. Thus, absorption layers 34 and radiation layers 36 cause increases in index of refraction. If these increases in index-of-refraction are not compensated for, the result is a spiky and asymmetric near field optical intensity profile such as the profile 40 shown in FIG. 8A. Consequently, the far field intensity profile resulting from these index-of-refraction changes is a profile which is relatively divergent and has significant side lobes.

Figure 8A:
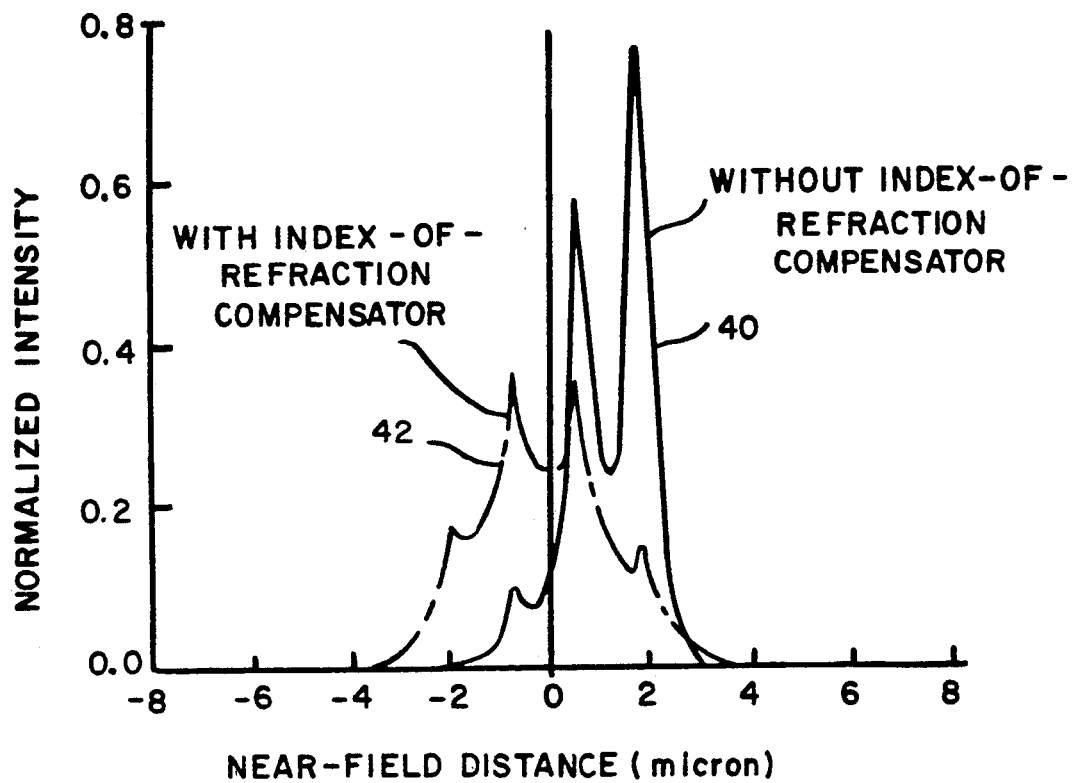
FIG. 8A is a diagram containing near field optical intensity profiles for the four element converter of FIGS. 7A and 7B and for such a converter without IRC layers.
Figure 8C:
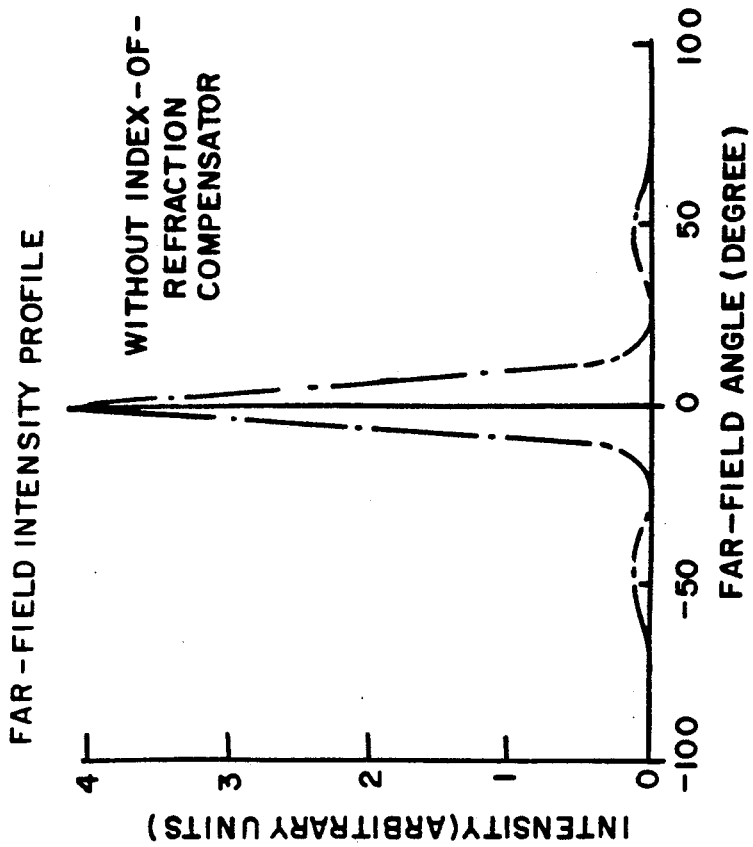
FIGS. 8B and 8C are diagrams containing far field optical intensity profiles for the same four element optical converter with and without IRC layers, respectively.
Figure 8B:
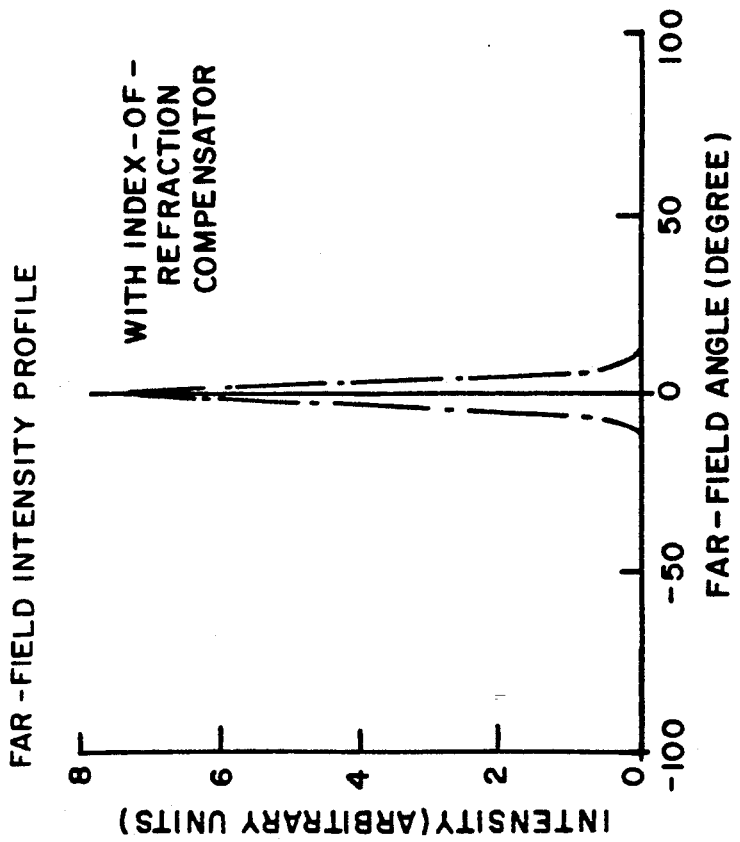

From FIG. 7B, it is seen that the effect of IRC layers 38 is to compensate for the index-of-refraction increases caused by the other layers, resulting in substantially no net change in index of refraction for the element. FIG. 8A shows that the near field optical intensity profile 42 with the index of refraction compensator layers is symmetric and far less spiky than the profile 40. This results in better mode matching and more efficient energy extractions. From FIG. 8B, it is seen that the far field intensity profile for the compensated converter is low divergence and has substantially no side lobes. This results in an output having a small numerical aperture which is the desired output for the converter of this invention.

Figure 9A:
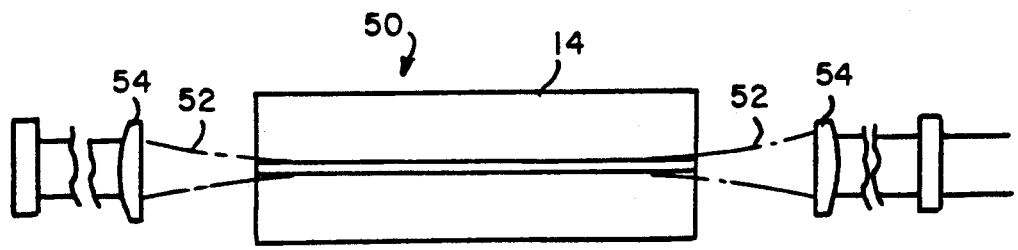
FIG. 9A is a side view of a laser employing a single optical converter of this invention.
Figure 9B:
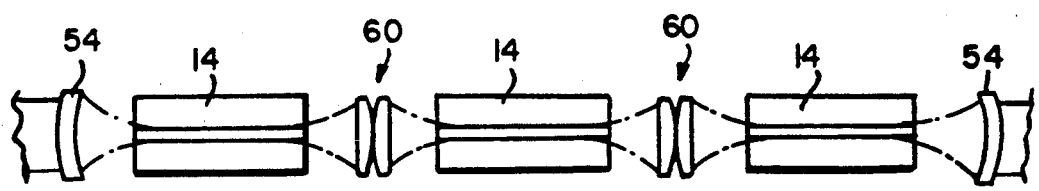
FIG. 9B is a side view of a laser employing three optical converters of this invention.

FIGS. 9A and 9B illustrate how the converter 14 of this invention might be utilized in a laser 50. Pump beam 18 (FIG. 1) would be directed into the page as shown in FIG. 9A, with output beams 52 being directed out of both ends of the converter. A lens 54 on each side of converter 14 focuses beam 52 to a mirror 56 and a partially reflective output coupler 58, respectively, the mirror and coupler defining the laser cavity. Because of the low numerical aperature converter 14 and its convergent optical intensity profile, lenses 54 may be compact, light and relatively inexpensive compared to those required for most current semiconductor diode lasers. Lasing in the laser cavity shown in FIG. 9A occurs in standard fashion.

FIG. 9B illustrates several of the optical converters 14 being serially coupled to achieve higher power. Each converter would be individually pumped. Again, the optical elements 60 required for focusing and coupling could be much smaller, lighter and less expensive than for comparable prior art lasers. It is believed that powers approaching 100 W with good beam quality could be achieved in a device of this type, the achievable output power being limited primarily by catastrophic damage to the medium. It is estimated that a converter 14 in accordance with the teachings of this invention can achieve conversion efficiencies of 50% or better.

An optical gain medium and systems for the use thereof have thus been provided which offers significant advantages over existing optical converters. While the invention has been particularly shown and described above with reference to preferred embodiments, it should be apparent that the foregoing and other changes in form and detail may be made therein by one skilled in the art without departing from the spirit and scope of the invention.

What is claimed is:

1. A solid state optical converter comprising:
   at least two optical converter elements, each of said elements including an absorber layer having an energy gap, and a radiator layer having a lower energy gap and a lesser width than said absorber layer, said radiator layer being positioned relative to said absorber layer to receive energy therefrom; and
   dielectric layers sandwiching and separating said optical converter elements.

2. A converter as claimed in claim 1 wherein each dielectric layer has a thickness, the gain profile for the converter being a function of the dielectric layer thickness.

3. A converter as claimed in claim 1 wherein each element layer has an index of refraction, and wherein each of said elements includes an IRC layer having an index of refraction lower than that of the absorber and radiator layers.

4. A converter as claimed in claim 3 including means for optically pumping the converter to a selected energy level, and wherein the IRC layers and the dielectric layers each have an energy gap greater than said selected energy level, and wherein the energy gaps for the absorber layers and the radiator layers are less than said selected energy level.

5. A converter as claimed in claim 3 wherein said IRC layers are selected to compensate for index of refraction changes induced by the absorber layer and the radiator layer to provide a non-divergent far field optical intensity profile for the converter and to minimize sidelobes.

6. A converter as claimed in claim 1 including means for optically pumping the converter with an optical beam having a wavelength $\lambda$, the thickness of said converter, including the thickness of both the optical converter elements and of the dielectric layers being much greater than $\lambda$.

7. A converter as claimed in claim 1 including an anti-reflection layer on one side of the converter permitting optical pumping of the converter elements therethrough.

8. A converter as claimed in claim 7 including a high reflectivity mirror on the side of said converter opposite said one side, said mirror reflecting an optical pump beam incident thereon back into the converter.

9. A converter as claimed in claim 1 wherein each active element layer is formed of a direct gap III–V semiconductor material.

10. An converter as claimed in claim 3 wherein said element has a plurality of absorber layers, each positioned to provide energy to a radiator layer.

11. A converter as claimed in claim 10 wherein each absorber layer has a thickness $d_a$ wherein there are n radiator layers each having a thickness $d_r$, and wherein $\Sigma d_a >> \Sigma d_r$.

12. A converter as claimed in claim 9 wherein the energy gap of at least one of said layers is graded, the corresponding element having an energy profile which is at least in part a function of the layer having a grading.

13. A converter as claimed in claim 3 wherein each of said element layers and dielectric layers has a superlattice configuration.

14. A solid state optical converter having gain and optical mode profiles comprising:
   at least one optical converter element, each said element including an optical energy absorber layer having a first energy gap and a first index of refraction, a radiator layer having a lower energy gap and a lesser width than said absorber layer and having a second index of refraction, said radiator layer being positioned relative to the absorber layer to receive energy therefrom, and an index of refraction compensator (IRC) layer having an index of refraction lower than said first and said second index of refraction, the IRC layers contributing to the said gain and optical mode profile; and
   dielectric layers sandwiching and separating said optical converter elements.

15. A solid state optical converter element having a predetermined energy profile, the element comprising:
   an optical energy absorber layer having a first energy gap and a first index of refraction;
   a radiator layer having a lower energy gap and a lesser width than said absorber layer and a second index of refraction, said radiator layer being positioned relative to the absorber layer to receive optical energy therefrom; and an index of refraction compensator (IRC) layer having an index of refraction lower than said first and second index of refractions, the IRC layer contributing to gain and optical mode profile.

16. An element as claimed in claim 15 wherein said element has a plurality of absorbent layers, each positioned to provide energy to a radiator layer.

17. An element as claimed in claim 16 wherein each absorber layer has a thickness $d_a$, wherein there are n radiator layers each having a thickness $d_r$, and wherein $\Sigma d_a \gg \Sigma d_{dr}$.

18. An element as claimed in claim 16 wherein the energy gap of at least one of said layers is graded, the corresponding element having an energy profile which is at least in part a function of the layer having a grading.

19. An element as claimed in claim 15 wherein said absorber layer and said radiator layer are formed of direct-gap III–V semiconductor materials.

* * * * *

UNITED STATES PATENT AND TRADEMARK OFFICE
CERTIFICATE OF CORRECTION

PATENT NO. : 5,313,324

DATED : May 17, 1994

INVENTOR(S) : Han Q. Le and William D. Goodhue

It is certified that error appears in the above-identified patent and that said Letters Patent is hereby corrected as shown below:

Please insert the followng paragraph in Column 1, line 4, after Field of the Invention:

--This invention was made with government support under Contract No. F19628-90-C-0002 by the Air Force. The government has certain rights in the invention.--

Signed and Sealed this

Fourth Day of October, 1994

Attest:

BRUCE LEHMAN

*Attesting Officer*  *Commissioner of Patents and Trademarks*